United States Patent [19]

Serrano

[11] 4,090,092
[45] May 16, 1978

[54] SHIELDING ARRANGEMENT FOR A CAPACITIVE TOUCH SWITCH DEVICE

[75] Inventor: Juan de. J. Serrano, Louisville, Ky.

[73] Assignee: General Electric Company, Louisville, Ky.

[21] Appl. No.: 705,830

[22] Filed: Jul. 16, 1976

[51] Int. Cl.² ............................................. H01H 35/00
[52] U.S. Cl. ............................. 307/116; 200/DIG. 1; 200/52 R
[58] Field of Search ........... 200/52 R, DIG. 1, 159 B; 340/365 C; 197/98; 307/116; 361/287, 280, 277

[56] References Cited

U.S. PATENT DOCUMENTS

| 3,406,802 | 10/1968 | Needham et al. | 192/130 |
| 3,492,440 | 1/1970 | Cerbone et al. | 197/90 |
| 3,496,381 | 2/1970 | Wisnia | 307/125 |
| 3,593,073 | 7/1971 | Atkins | 361/275 |
| 3,761,736 | 9/1973 | Edge et al. | 307/116 |
| 3,797,630 | 3/1974 | Zilkha | 197/98 |
| 3,862,381 | 1/1975 | Glaister et al. | 200/159 B X |
| 3,886,539 | 5/1975 | Gould, Jr. | 340/337 |
| 3,951,250 | 4/1976 | Pointon | 340/365 C X |

OTHER PUBLICATIONS

Electronics, Fred G. Geil; "MOSFET, Takes the Push Out of Elevator Pushbutton"; Oct. 30, 1967; pp. 70, 71.

Primary Examiner—James R. Scott
Attorney, Agent, or Firm—Steven C. Schnedler; Francis H. Boos

[57] ABSTRACT

A capacitive touch switch device includes a panel in the form of a dielectric sheet element, a touch pad on the front of the panel, and at least a sensing pad on the rear of the panel. A conductive grounded shield plate is also disposed generally upon the rear side of the panel and substantially surrounds the sensing pad.

8 Claims, 12 Drawing Figures

U.S. Patent   May 16, 1978   Sheet 1 of 4   4,090,092
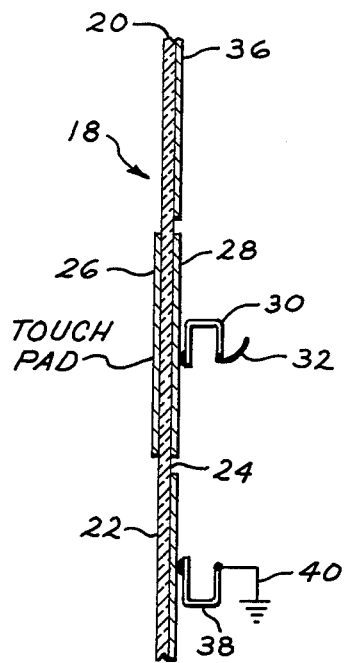
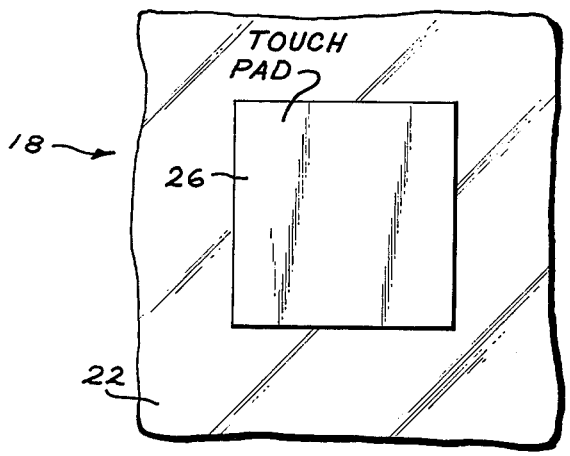
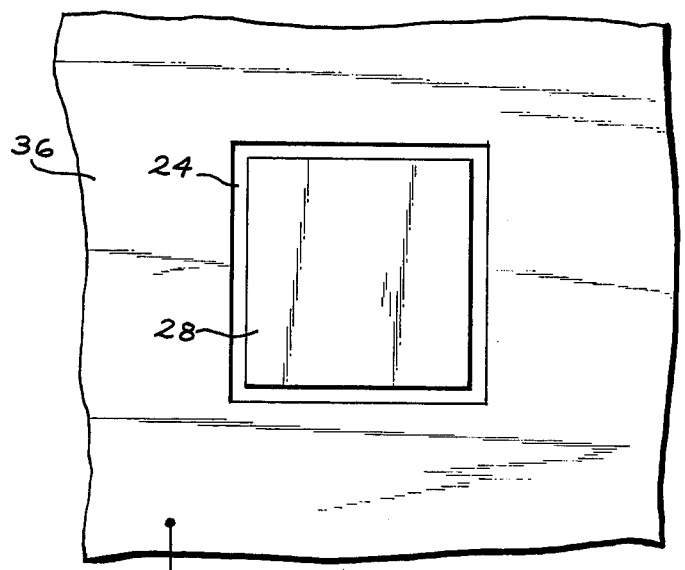
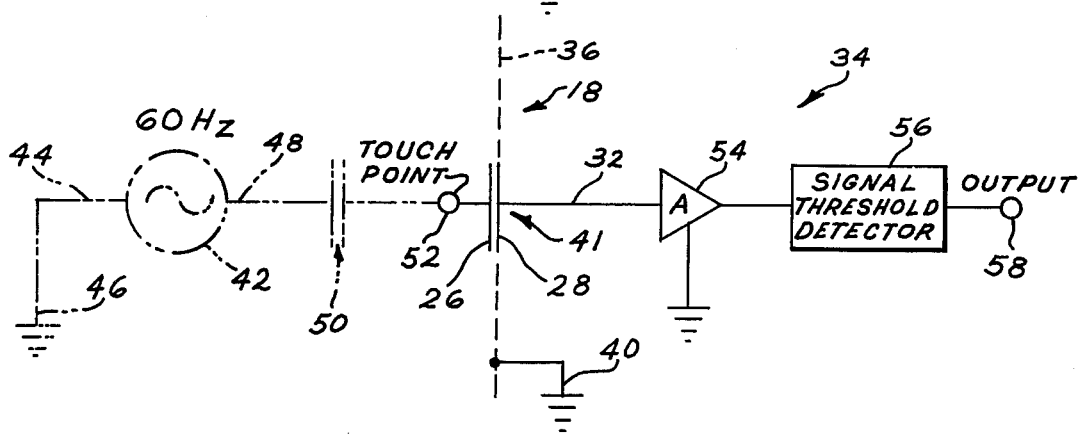

SHIELDING ARRANGEMENT FOR A CAPACITIVE TOUCH SWITCH DEVICE

BACKGROUND OF THE INVENTION

1. Field of the Invention

The present invention relates generally to capacitive touch switches and, more particularly, to a shielding arrangement for reducing the sensitivity of a capacitive touch switch to stimuli other than an actual human touch.

2. Description of the Prior Art

Touch switches have certain advantages when employed as user control inputs in appliances and the like. Their general advantages include making it possible to have a smooth control panel surface for good appearance and easy cleaning, eliminating reliability problems caused by mechanically movable switch contacts, and permitting convenient interface to circuitry in so-called "electronic" appliances. For example, touch switches have been applied to both conventional electric ranges and countertop microwave ovens, in both cases in combination with circuitry employing digital logic techniques.

Touch switches are of two general types: resistance bridging and capacitive. In the resistance bridging type of touch switch, a touch element includes at least two electrodes. When a person touches the touch element, skin resistance across the two electrodes is sensed by associated circuitry which produces a control output. The capacitive type of touch switch, on the other hand, does not depend upon skin resistance, but rather depends on capacitive effects associated with the human body. The present invention is applicable to the capacitive type of touch switch, which type is more fully described below.

Capacitive touch switch devices generally include a panel or substrate in the form of a dielectric sheet element, for example a glass panel. The panel is also known as a "crystal." A conductive touch pad is disposed upon the front side of the panel. On the rear side of the panel, just opposite the touch pad, there is disposed at least a conductive sensing pad. The front touch pad and the rear sensing pad thereby form the two plates of a capacitor, with the panel serving as the dielectric between the two capacitor plates.

There are two specific types of prior art capacitive touch switch systems to which the present invention is applicable. The first is the "60 Hz pickup" type, which depends upon an external signal being inserted into the system through the touch pad. The second is the "capacitive attenuator" type, which shunts an internally-generated signal to ground when a person touches the touch pad. Both of these specific types are described in greater detail below under the heading, "Description of the Preferred Embodiments."

One disadvantage associated with the capacitive touch switches of either of the above types is undesired response to stimuli other than the actual touch of a human finger. This may occur, for example, when the system responds in apparently random fashion to a change in external electric fields. Another example of undesired response is a response to a human finger or other object coming close but not actually touching the touch pad. Desirably, a touch switch should function only as a touch switch, and not as a proximity detector. Of course, this latter effect cannot be entirely eliminated because, since the touch switch is a capacitive device, when an object such as a finger is close to the touch plate, for example, less than one-quarter inch, substantial coupling can occur. This effect can be minimized but not completely eliminated.

One approach to minimizing this undesired response is providing a gounded shield generally over the front of the panel, with openings in the shield exposing the touch pad beneath. Such a shield does effectively reduce the response of the touch switch system to undesired stimuli and can effectively prevent external stray capacitances from triggering the system. It is particularly effective in preventing undesirable response when a person's finger is near, but not too near, the touch pad; for example, two inches away as compared to one-quarter inch away. In such case, due to the relative nearness of the grounded shield as compared to the finger, capacitance associated with the finger produces a relatively minor effect on the circuit.

However, such a grounded shield disposed generally on the front side of the panel is not without its disadvantages. One example is awkward construction, particularly with regard to indicia and decorative patterns which may be placed on the front of the panel. Further, the use of a metallic shield over the front of a glass panel, even though the shield material may be rather thin, detracts from aesthetic qualities otherwise possible with such a smooth glass panel.

The present invention provides shielding for such capacitive touch switches in an improved manner which does not require a conductive shield placed over the front of a panel with its attendant disadvantages.

SUMMARY OF THE INVENTION

Accordingly, it is an object of the invention to provide an improved capacitive touch switch device for minimizing undesired response to extraneous stimuli.

This and other objects are accomplished by the invention which improves capacitive touch switch devices by providing a conductive shield plate disposed generally on the rear side of the dielectric panel substantially surrounding, but not touching the sensing pad. The shield plate includes means for connection to the common circuit reference point, for example "ground." The shield plate may comprise conductive material formed directly upon the rear side of the panel or, alternatively, may be formed by metallized adhesive film applied to the rear side of the panel, the metallized adhesive film being of sandwich construction having metal foil and adhesive on either side of a flexible sheet.

Contrary to what might be expected, such a shielding plate, even though it is disposed only on the rear side of the panel, is quite effective in accomplishing the desired objective. Furthermore, in addition to providing a shielding effect, the shield plate enhances the stability of the system by bringing a ground reference closer to the pads. Without the shield plate, the touch plate and the panel are more or less "floating," with no nearby stabilizing ground reference.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in conjunction with the drawings, in which:

FIG. 1 is a fragmentary sectional side view of a capacitive touch switch device of the "60 Hz pickup" type with a conductive shield plate according to the present invention disposed on the rear side of the panel;

FIG. 2 is a fragmentary view of the front of the touch switch device of FIG. 1 (viewed from the left side of FIG. 1) showing the touch pad and the surrounding panel;

FIG. 3 is a rear view of the touch switch device shown in FIG. 1 (viewed from the right side of FIG. 1) illustrating the sensing pad, the shield plate according to the present invention and, interspaced therebetween, a portion of the panel;

FIG. 4 is a schematic circuit diagram of a "60 Hz pickup" type touch switch system including a schematic representation of the touch switch device of FIGS. 1 through 3;

DESCRIPTION OF THE PREFERRED EMBODIMENTS

Figure 5:
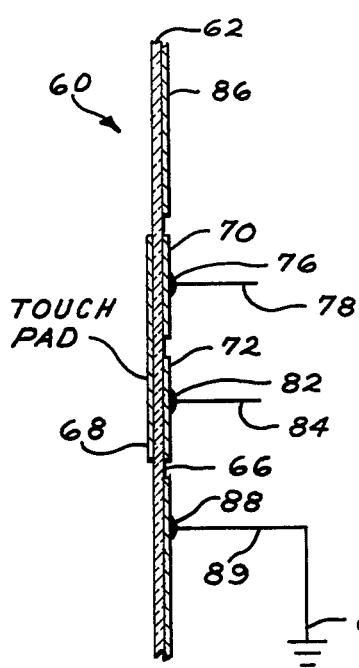
FIG. 5 is a view similar to FIG. 1 showing a fragmentary sectional side view of a touch switch device of the "capacitive attenuator" type having two rear pads and including a conductive shield plate according to the present invention.

Referring first to FIGS. 1, 2, and 3, a capacitive touch switch device 18 for use in a "60 Hz pickup" type touch switch system includes a dielectric sheet element 20 having front and rear sides 22 and 24. The dielectric sheet element 20 may be any suitable dielectric substance suitable for use as a panel; for example, glass, plastic, or glass-epoxy. It will be understood that the dielectric sheet element 20 is the substrate of a control panel and that the front side 22 faces outwardly toward the user. While a flat sheet element 20 is illustrated, it may have protrusions or recesses which may be desired to achieve a particular appearance, even in the areas which are touch-sensitive.

A conductive touch pad 26 is disposed generally upon the front side of the sheet element 20 and is adapted for being touched by a human finger. For clarity of illustration, the thickness of the touch pad 26 relative to the thickness of the dielectric sheet element 20 is exaggerated. As is well known to those skilled in the art, the touch pad 26 may, for example, be a thin foil adhesively bonded to the front side 22 of the sheet element 20 or may be formed by depositing a relatively thin layer of a substance such as tin oxide which is conductive, but yet may be applied in a sufficiently thin layer so as to be transparent. In such case, assuming the dielectric sheet element 20 itself is transparent, indicating lamps (not shown) may be positioned behind the sheet element or panel 20. Additionally, any of the known techniques for producing conductive paths on printed circuit boards may be adapted for forming the touch pad 26.

Mounted generally on the rear side 24 of the dielectric sheet element 20 is a conductive sensing pad 28 which is adapted for connection to external circuit means. The touch pad 26 and the sensing pad 28 are in overlapping relationship, thereby forming the two plates of a capacitor. In FIG. 1, the sensing pad 28 is adapted to mate with a spring contact 30 and a conductor 32 leading to circuitry 34 (FIG. 4). This construction employing spring contacts for electrical connection has the advantage that the device 18 comprising the panel and associated pads may be fabricated as a unit, separate from the spring contacts and associated circuitry. Assuming the various pads and spring contacts are properly aligned, the complete panel is easily installed by simply mounting it in place.

In the improvement contemplated by the invention, a conductive shield plate 36 is disposed generally upon the rear side 24 of the dielectric sheet element 22 substantially surrounding but not touching the sensing pad 28. While the shield plate 36 is shown completely surrounding the sensing pad 28, it may be interrupted. The shield plate 36 is adapted for connection to a common circuit reference point. In FIG. 1, a spring contact 38, similar to the spring contact 30, is employed for this purpose. The common circuit reference point may be generally described as a ground connection 40, but it will be understood by those skilled in the art the connection to an actual earth ground is not required. Connection to any relatively large conductive surface such as the cabinet of an appliance itself is sufficient. Furthermore, the connection to the circuit reference point such as the ground 40 need not be through a direct conductor, but may be accomplished through a capacitance which is substantially larger than the capacitances associated with the pads 26 and 28.

In the embodiment illustrated in FIGS. 1 through 3, the shield plate 36 is directly metallized on the front and rear sides 22 and 24 of the sheet element 20. As will be apparent later, particularly with reference to the description of the embodiment shown in FIG. 12, other means for forming the conductive shield plate 36 upon the rear side 24 of the dielectric sheet element 20 may be employed. Further, any of the techniques referred to above for forming the touch pad 26 may be adapted for fabrication of the shield plate 36. It will therefore be understood that the present invention is not limited to any one particular shield plate construction.

Referring now to FIG. 4, there is shown in block schematic form circuitry 34 of a complete "60 Hz pickup" touch control system including a schematic representation of the capacitive touch switch device 18 of FIGS. 1 through 3. The touch pad 26 and the sensing pad 28 are shown in their equivalent form as the two plates of a capacitor 41. The conductive shield plate 36 is shown in general coplanar relationship with the sensing pad 28.

The 60 Hz electric fields in space surrounding AC power lines are schematically represented as a generator 42, shown in phantom lines. In order to form a complete circuit, one terminal 44 of the generator 42 is shown connected to ground 46. The other generator terminal 48 is connected to a capacitor 50, also shown in phantom lines, which represents the capacitance of a human body coupled to the 60 Hz electric fields. In FIG. 4, a representation of the connection between the phantom capacitor 50 and the touch pad 26 is shown as through a touch point 52. It will be understood that, in the actual physical device 18 (FIGS. 1-3), the touch point 52 is actually the touch pad 26 itself, the touch pad 26 serving both as a touch point and as a capacitor plate.

The conductor 32 connects the sensing pad 28 to the input of a high input impedance amplifier 54. The output of the amplifier 54 is connected to a signal threshold detector 56 which produces a signal at its output terminal 58 when the signal applied at its input reaches a predetermined level.

The general operation of a "60 Hz pickup" capacitive touch switch system is well known to those skilled in the art. Referring to FIGS. 1-4, when a person touches the touch pad 26 (or the schematic equivalent touch point 52), the signal from the representative 60 Hz generator 42 is coupled through the human body capacitance 50 and through the capacitor comprising plates 26 and 28 to the input of the amplifier 54. This signal may be described as a "hum" and is familiar to anyone who has touched the input of a high-gain audio amplifier. The hum-like signal is further amplified and applied to the input of the signal threshold detector 56 which, in response, produces a signal at the output 58, indicating that the touch pad 26 has been touched.

As pointed out above under the heading "Background of the Invention," a basic prior art touch switch system (not including the shield plate 36) has undesired sensitivity to stimuli other than an actual touch. The shield plate 36, according to the present invention, effectively functions to minimize the effects of external stimuli on the operation of the circuit. Not only does the shield plate 36 provide what may be understood as a shielding effect, but it additionally stabilizes the system by providing a ground reference plane near the sensing pad 28.

Figure 6:
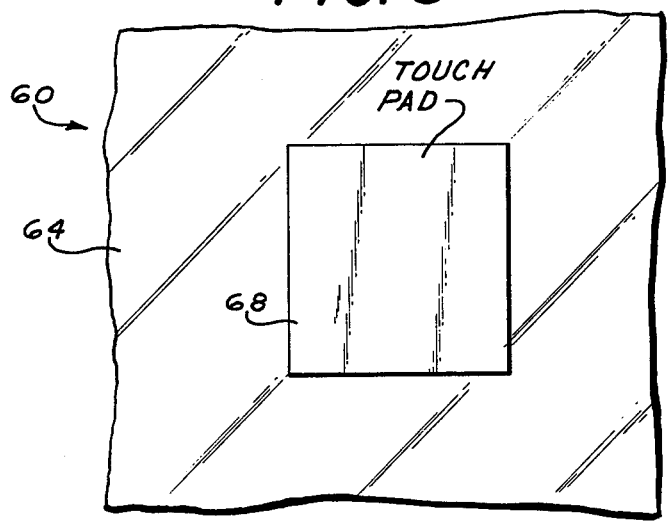
FIG. 6 is a view similar to FIG. 2 showing the front of the touch switch device of FIG. 5.
Figure 7:
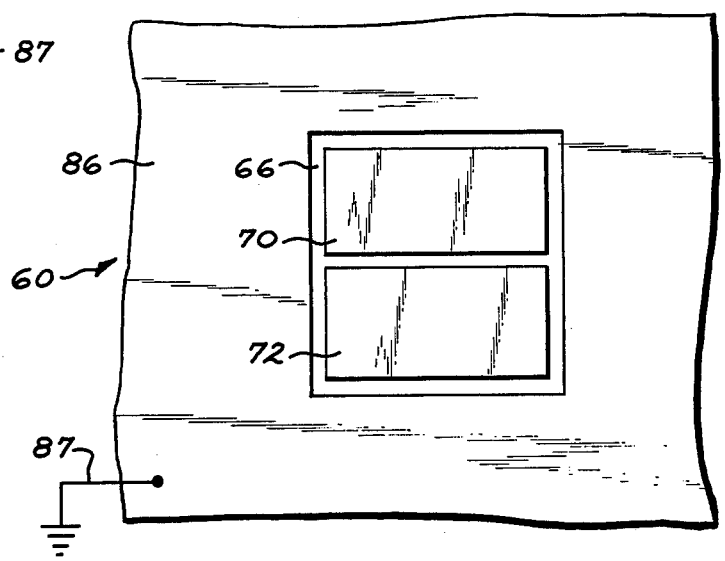
FIG. 7 is a view similar to FIG. 3 and shows the rear of the touch switch device of FIG. 5.

Referring now to FIGS. 5, 6, and 7, there is shown a touch switch device 60 for use in a "capacitive attenuator" type system. As in the device 18 (FIG. 1), the capacitive touch switch device 60 includes a panel comprising a dielectric sheet element 62 having front and rear sides 64 and 66. Disposed on the front side 64 is a touch pad 68 adapted to be touched by a human finger. As in the FIG. 1 embodiment, the touch pad 68 may be any suitable conductive pad; for example, a thin layer of tin oxide deposited directly on the dielectric sheet element 62. On the rear side 66, instead of the single conductive sensing pad 28 (FIGS. 1-3), there are a pair of conductive pads 70 and 72. A portion of each of the rear pads 70 and 72 is in overlapping relationship with the touch pad 68, thereby forming, with the touch pad 68, the two plates of a capacitor. Specifically, a first capacitor is formed by one rear pad 70 and the touch pad 68, and a second capacitor is formed by the touch pad 68 and the other rear pad 72. It will be apparent that the touch pad 68 forms a plate common to both of these capacitors. In the embodiment illustrated in FIG. 5, the rear pads 70 and 72 completely overlap the touch pad 68.

Figure 8:
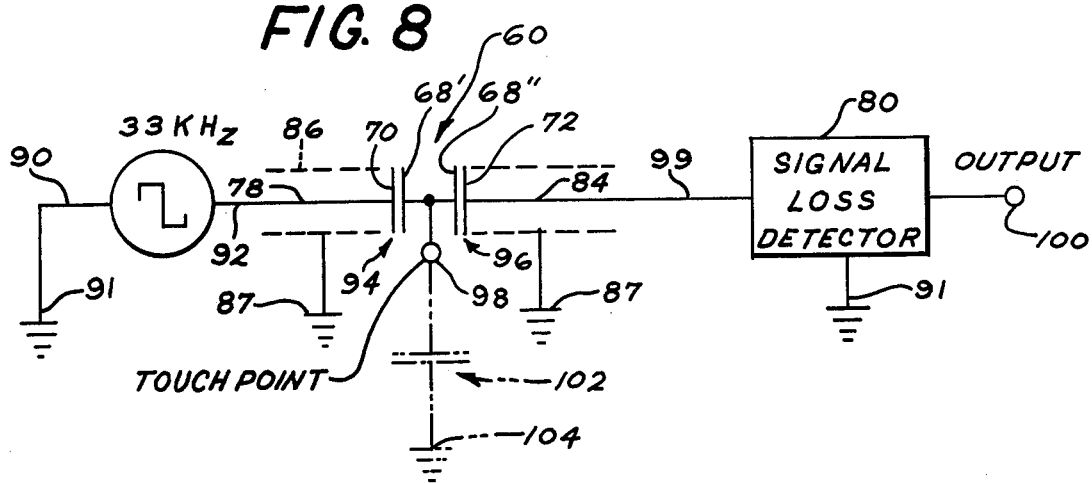
FIG. 8 is a schematic circuit diagram of a "capacitive attenuator" type touch switch system including a schematic representation of the touch switch device of FIGS. 5 through 7.
Figure 9:
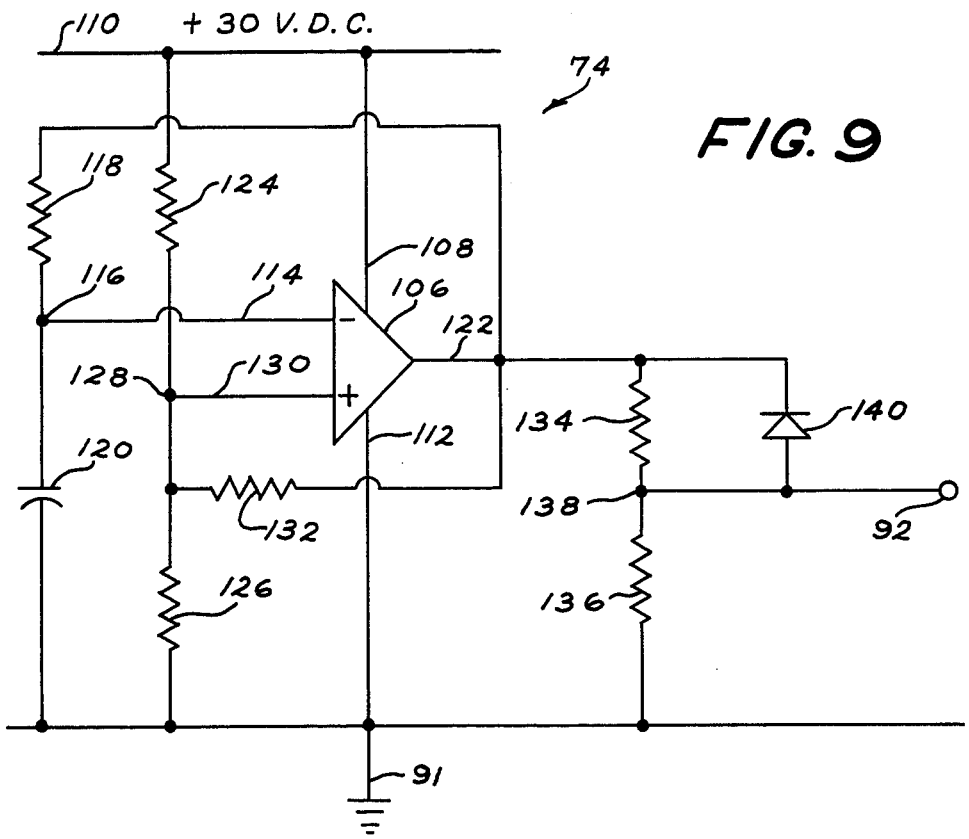
FIG. 9 is a detailed schematic circuit diagram of a square wave oscillator which may be used in the circuit of FIG. 8.

The one rear pad 70 is adapted for connection to a suitable alternating current signal source, such as a square wave oscillator 74 (FIGS. 8 and 9). The oscillator 74 may be termed a "transmitter" and the one rear pad 70 may be termed a "transmitter pad." In the FIG. 5 embodiment, this connection is made by a solder joint 76 to a conductor 78, it being understood that this is only one of several possible means for connecting the one pad 70 to the circuitry. For example, a system of spring contacts such as shown in FIG. 1 may be applied as well.

Figure 10:
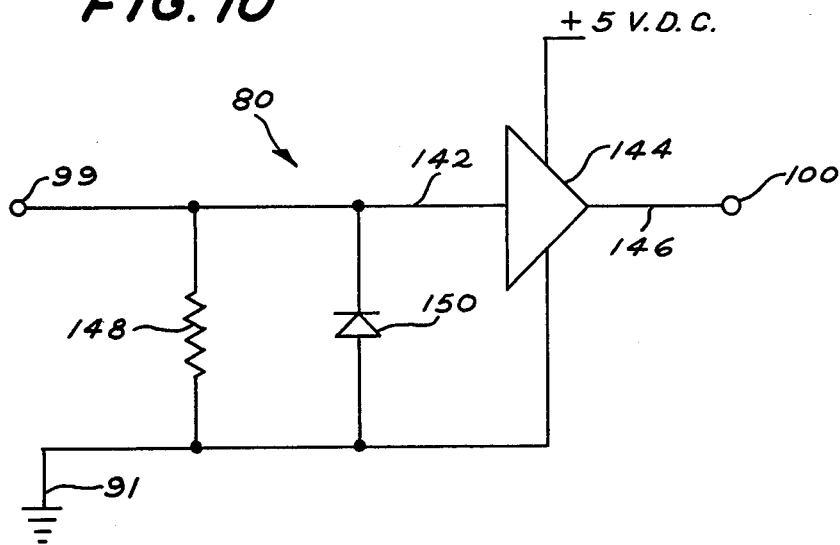
FIG. 10 is a detailed schematic circuit diagram of a signal loss detector which may be used in the circuit of FIG. 8.

The other rear pad 72 is adapted for connection to a signal loss detector 80 (FIGS. 8 and 10). The signal loss detector 80 may also be termed a "receiver" and the other pad 72 may be termed a "receiver pad." Additionally, the other rear pad 72 may be called a sensing pad. Similarly, a solder joint 82 to a conductor 84 is employed for this connection.

In accordance with the present invention, there is disposed on the rear side 66 of the dielectric sheet element 62 a conductive shield plate 86 substantially surrounding but not touching the rear pads 70 and 72. The shield plate 86 includes means for connection to a common circuit reference point 87 and is formed in the same manner as the shield plate 26 (FIGS. 1 and 3). Again, a solder joint 88 and a conductor 89 are employed for the connection.

Referring now to FIG. 8, there is shown in block schematic form the circuitry of a complete "capacitive attenuator" type switch system, including a schematic representation of the touch switch device 60 of FIGS. 5, 6, and 7. The oscillator or transmitter 74 produces an alternating current signal; for example, a signal having a square waveform and a frequency of 33 KHz. This square wave signal appears between a ground terminal 90 connected to a circuit ground 91 and an output terminal 92. The output terminal 92 is connected through the conductor 78 to the one rear pad 70. In FIG. 8, the touch pad 68 (FIG. 5) is shown in its equivalent form as two capacitor plates 68' and 68''. Thus, the one rear pad 70 and the plate 68' together form a capacitor 94, and the plate 68'' and the other rear pad 72 form the two plates of another capacitor 96, the two capacitors 94 and 96 sharing a common plate formed by the touch pad 68. In the schematic representation there is shown a touch point 98 which, in the actual physical touch switch device 60 (FIGS. 5-7), is the touch pad 68 itself. The touch pad 68 serves both as a touch point and as a plate common to two capacitors.

The other rear pad 72 is connected through the conductor 84 to an input 99 of the signal loss detector or receiver 80. The signal loss detector functions to produce an output at the input terminal 100 when it senses a loss in signal.

The capacitance of a human body to ground is represented by a capacitor 102 and a ground connection 104, both shown in phantom lines. When a person touches the touch point 98, the circuit configuration of FIG. 8 is completed, and will be recognized as including a conventional capacitive "T" type attenuator comprising capacitors 94, 96, and 102.

The conductive shield plate 86 according to the present invention is illustrated schematically in FIG. 8 as generally surrounding the conductors 78 and 84 and extending up to, but not touching, the rear pads 70 and 72.

In the general operation of a "capacitive attenuator" type touch switch system such as that shown in FIGS. 5-8, when the touch pad 68 (or the schematic equivalent touch point 98) is not being touched, a signal from the transmitter or oscillator 74 is coupled through the capacitors 94 and 96 into the input 99 of the signal loss detector 80. When a person touches the touch pad 68, the capacitor 102 is inserted into the circuit, shunting a significant portion of the signal from the oscillator 74 to ground. This causes a decrease in the signal supplied to the signal loss detector 84 which, in response, produces a signal at its output 100 indicating that the touch pad 68 has been touched.

As in the previously-described embodiment, the shield plate 86 according to the present invention effectively functions to minimize the effects of external stimuli. It functions effectively even though disposed only on the rear side 66 of the panel.

Referring now to FIG. 9, a suitable circuit for the transmitter or oscillator 74 of FIG. 8 is shown. The transmitter 74 is a free-running 33 KHz square wave oscillator and includes an operational amplifier 106 as its active device. The positive supply voltage terminal 108 of the operational amplifier 106 is connected to a bus 110 carrying a positive 30 volt DC supply voltage. The negative supply voltage terminal 112 is connected to the circuit ground 91. The operational amplifier inverting input 114 is connected to the junction 116 of an RC timing network comprising a timing resistor 118 and a timing capacitor 120. The other terminal of the timing resistor 118 is connected to the output 122 of the operational amplifier 106 and the other terminal of the timing capacitor 120 is connected to the circuit ground 91. Equal-valued resistors 124 and 126 comprise a reference voltage divider having a tap point 128 connected to the operational amplifier non-inverting input 130. The voltage divider formed by the resistors 124 and 126 is connected between the DC bus 110 and circuit ground 91. A positive feedback resistor 132, having the same resistance as the resistors 124 and 126, is connected between the operational amplifier output 122 and the non-inverting input 130. The operational amplifier output terminal 122 is connected to the upper terminal of an output voltage divider comprising resistors 134 and 136, and the tap point 138 is connected to the transmitter output terminal 92. A diode 140 with its cathode connected to the operational amplifier output terminal 122 and its anode connected to the output terminal 92 serves to bypass the resistor 134 when the output of the operational amplifier 106 is near ground potential.

In the operation of the transmitter 76, the charge on the timing capacitor 120 appearing at the tap point 116 is compared by the operational amplifier 106 to the reference voltage appearing at the tap point 128. The actual voltage appearing at the tap point 128 and supplied to the non-inverting input 130 depends not only upon the values of the voltage divider resistors 124 and 126, but upon the value of the positive feedback resistor 132 and upon the output voltage appearing at the operational amplifier output terminal 122.

Assuming that the timing capacitor 120 is initially discharged, the voltage at the inverting input 114 is zero and the voltage at the non-inverting input 130 is at some positive value. This causes the operational amplifier output terminal 122 to go positive up to nearly the 30 volt DC power supply voltage. This causes two things to happen: First, the timing capacitor 120 begins charging through the timing resistor 118 up to the voltage appearing at the output 122. Second, the positive feedback resistor 132 and the upper voltage divider resistor 124 are effectively connected in parallel. As a result, assuming that the resistors 124, 126, and 132 are all of equal value, the reference voltage supply to the non-inverting input 130 is equal to approximately two-thirds of the power supply voltage, or 20 volts. When the timing capacitor 120 finally charges up to just over 20 volts, the voltage on the inverting input 114 is more positive than the voltage on the non-inverting input 130, causing the output 112 to rapidly go nearly to zero. This immediately causes the timing capacitor 120 to begin discharging through the timing resistor 118 and additionally shifts the reference voltage supplied to the non-inverting input 130 down to approximately 10 volts, since now the positive feedback resistor 132 is effectively in parallel with the lower voltage divider resistor 126. It will be apparent, therefore, that a square wave oscillation results as the cycle of operation continues. A square wave signal appears at the operational amplifier output terminal 122 and is coupled through the output voltage divider to the output terminal 92.

Referring now to FIG. 10, there is shown a schematic diagram of one form which the signal loss detector or receiver 80 of FIG. 8 may take. The receiver input terminal 99 is connected to the input 142 of an amplifier 144. The output 146 of the amplifier 144 is connected to the output terminal 100 of the signal loss detector 82. In order to rectify the alternating current input supplied at the input terminal 99, and to protect the input of the amplifier 144 from negative voltage pulses, a parallel combination of a high resistance resistor 148 and a rectifying diode 150 is connected between the input 142 and the circuit ground 91.

In operation, when an alternating current signal is present at the input 99, the rectifying diode 150 causes a pulsed positive DC voltage signal to appear at the amplifier input 142. When the signal supplied to the input 99 drops due to the touch pad 68 (FIGS. 5 and 6) being touched, the voltage at the amplifier input 142 drops, causing a signal to be produced at the output terminal 146 and at the signal loss detector output 100. In this circuit, the presence of a signal is represented by a logic zero, i.e., a low voltage.

In a preferred embodiment of the invention, values for the circuit components of FIGS. 9 and 10 are as follows. These values are exemplary only, and are not intended to limit the scope of the invention:

| AMPLIFIERS | |
|---|---|
| 106 | National Semiconductor LM301AN |
| 144 | Motorola 14010 |
| CAPACITOR | |
| 120 | 0.001 mfd. |
| DIODES | |
| 140 | 1N914 |
| 150 | 1N914 |
| RESISTORS | |
| 118 | 15 K ohm |
| 124 | 100 K ohm |
| 126 | 100 K ohm |
| 132 | 100 K ohm |
| 134 | 2.7 K ohm |
| 136 | 2.7 K ohm |
| 148 | 22 Meg. ohm |

Figure 11:
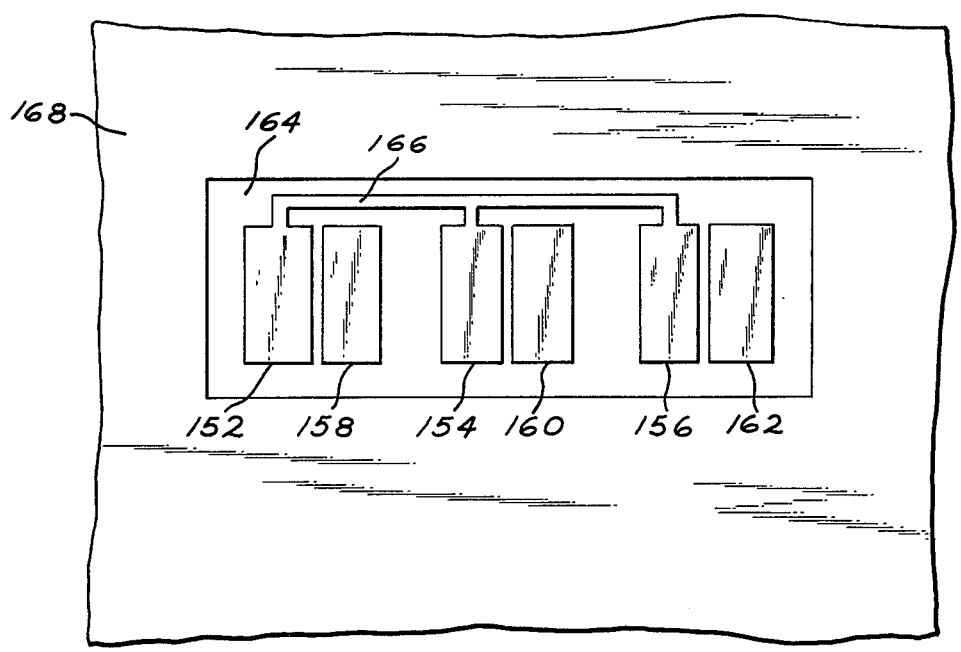
FIG. 11 is a view similar to FIG. 7 showing a shielding plate applied to the rear side of a panel including a plurality of capacitive touch switch devices.

Referring now to FIG. 11, which may be compared to FIG. 7, there is shown an embodiment in which the conductive shield plate of the present invention is applied to a touch switch system including a plurality of touch switch devices generally adjacent one another. In FIG. 11, the rear side only of an array including three touch switch devices is shown. The front side includes three touch pads which are identical to the previously-described touch pads. The three touch switch devices include transmitter pads 152, 154, and 156 and respective receiver pads 158, 160, and 162, all disposed on the rear side 164 of a dielectric sheet element. Since all three transmitter pads 152, 154, and 156 are to be connected to the output of a single transmitter, they are connected to each other through a conductive circuit path 166, and only one of the transmitter pads need be directly connected to the transmitter output.

A conductive shield plate 168 according to the present invention is also disposed generally on the rear side 164 of the dielectric sheet element and generally surrounds all of the rear pads. It will be apparent, therefore, that the advantages of the present invention can be realized with multiple touch switch devices and even though each pair of rear pads is not individually substantially surrounded by the shield plate 168.

Figure 12:
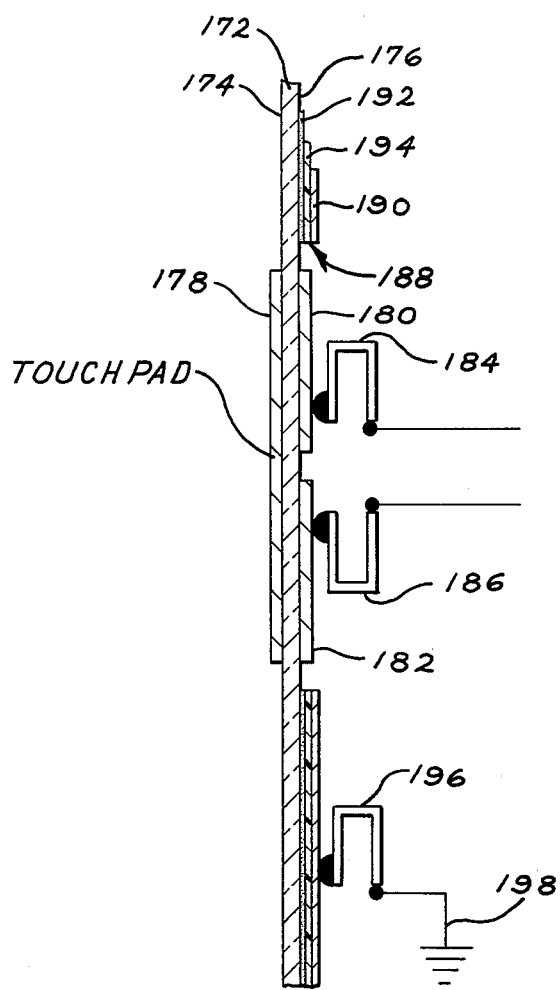
FIG. 12 is an alternative construction of a device according to the present invention including a metallized adhesive film applied to the rear side of the panel.

FIG. 12 illustrates another physical form which a shield plate according to the present invention may take. The capacitive touch switch device 170, as in all the previously-described embodiments, includes a dielectric sheet element 172 to serve as a panel or substrate. The sheet element 172 has front and rear sides 174 and 176 and additionally includes a conductive touch pad 178 disposed generally upon the front side 174. A pair of pads 180 and 182 are mounted on the rear side 176. The rear pads 180 and 182 are adapted to be contacted by spring contacts 184 and 186 for connection to a transmitter and a receiver respectively.

A shield plate according to the present invention comprises a metallized adhesive film, generally designated at 188, applied to the rear side 176 of the dielectric sheet element 172. The metallized adhesive film 188 is of sandwich construction, having metal foil 190 and adhesive 192 on opposite sides of a flexible sheet base 194. The flexible sheet base 194 may be formed of any suitable material; for example, paper or mylar film. In this embodiment, the metal foil 190 will be recognized as the actual shield plate, fully equivalent to the previously-described shield plates 36 (FIGS. 1 and 3), 86 (FIGS. 5 and 7), and 168 (FIG. 11). It will be understood that the thicknesses of the various layers of the film 188 are greatly exaggerated for clarity of illustration, particularly the thickness of the adhesive 192. As in the FIG. 1 embodiment, in FIG. 12 the metal foil 190 is adapted to be contacted by a spring contact 196 for connection to a circuit reference point, for example ground 198.

It will be apparent therefore that the present invention provides shield structure for a capacitive touch switch device which is effective to reduce the response of the system to extraneous stimuli and yet does not interfere with the front of the panel.

While specific embodiments of the invention have been illustrated and described herein, it is realized that modifications and changes will occur to those skilled in the art. It is therefore to be understood that the appended claims are intended to cover all such modifications and claims as fall within the true spirit and scope of the invention.

What is claimed is:

1. In a capacitive touch switch device of the type having: a dielectric sheet element with front and rear sides; a conductive touch pad disposed generally upon the first side of the dielectric sheet element; and a conductive sensing pad disposed generally upon the rear side of the dielectric sheet element with at least a portion thereof in overlapping relationship with the touch pad, the touch pad and the sensing pad thereby forming the two plates of a capacitor, the sensing pad adapted for connection to circuit means for producing an output in response to the touch pad being touched; the improvement comprising:
a conductive shield plate disposed generally upon the rear side of the dielectric sheet element substantially surrounding, but not touching, the sensing pad; said shield plate having means for connection to a common circuit reference point, whereby undesirable response to extraneous stimuli is minimized.

2. The touch switch system of claim 1, wherein said shield plate is substantially coplanar with the sensing plate.

3. The touch switch device of claim 1, wherein said shield plate comprises conductive material formed directly upon the rear side of the dielectric sheet element.

4. In a capacitive touch switch device of the type having: a dielectric sheet element with front and rear sides; a conductive touch pad disposed generally upon the front side of the dielectric sheet element; and a conductive sensing pad disposed generally upon the rear side of the dielectric sheet element with at least a portion thereof in overlapping relationship with the touch pad, the touch pad and the sensing pad thereby forming the two plates of a capacitor, the sensing pad adapted for connection to circuit means for producing an output in response to the touch pad being touched; the improvement comprising:
a conductive shield plate in the form of a metallized adhesive film of sandwich construction having a flexible sheet base with adhesive on one side of said flexible sheet base and metal foil on the other side of said flexible sheet base;
said metallized adhesive film adhered by means of said adhesive to the rear side of the dielectric sheet element and substantially surrounding, but not touching, the sensing pad;
said metal foil having means for connection to a common circuit reference point, whereby undesirable response to extraneous stimuli is minimized.

5. In a capacitive touch switch device of the type having: a dielectric sheet element with front and rear sides; a conductive touch pad disposed generally upon the front side of the dielectric sheet element; a pair of conductive pads disposed generally upon the rear side of the dielectric sheet element with at least a portion of each rear pad in overlapping relationship with the touch pad, each of the rear pads thereby forming, with the touch pad, the two plates of a capacitor, the touch pad being common to the two capacitors thereby formed, one of the rear pads adapted for connection to an alternating current signal source and the other of the rear pads adapted for connection to a signal loss detector, whereby in use the capacitive shunting effect to ground of a person touching the touch pad causes a decrease in signal supplied to the signal loss detector, the improvement comprising:
a conductive shield plate disposed generally upon the rear side of the dielectric sheet element substantially surrounding, but not touching, the pair of rear pads; said shield plate having means for connection to a common circuit reference point, whereby undesirable response to extraneous stimuli is minimized.

6. The touch switch device of claim 5, wherein said shield plate is substantially coplanar with the rear pads.

7. The touch switch device of claim 5, wherein said shield plate comprises conductive material formed directly upon the rear side of the dielectric sheet element.

8. In a capacitive touch switch device of the type having a dielectric sheet element with front and rear sides; a conductive touch pad disposed generally upon the front side of the dielectric sheet element; a pair of conductive pads disposed generally upon the rear side of the dielectric sheet element with at least a portion of each rear pad in overlapping relationship with the touch pad, each of the rear pads thereby forming, with the touch pad, the two plates of a capacitor, the touch pad being common to the two capacitors thereby formed, one of the rear pads adapted for connection to an alternating current signal source and the other of the rear pads adapted for connection to a signal loss detector, whereby in use the capacitive shunting effect to ground of a person touching the touch pad causes a decrease in signal supplied to the signal loss detector, the improvement comprising:

a conductive shield plate in the form of a metallized adhesive film of sandwich construction having a flexible sheet base with adhesive on one side of said flexible sheet base and metal foil on the other side of said flexible sheet base;

said metallized adhesive film adhered by means of said adhesive to the rear side of the dielectric sheet element and substantially surrounding, but not touching, the pair of rear pads;

said metal foil having means for connection to a common circuit reference point, whereby undesirable response to extraneous stimuli is minimized.

* * * * *